United States Patent [19]
Saitou et al.

[11] Patent Number: 5,311,026
[45] Date of Patent: May 10, 1994

[54] CHARGED PARTICLE BEAM LITHOGRAPHY SYSTEM AND METHOD THEREFOR

[75] Inventors: Norio Saitou, Iruma; Yoshihiko Okamoto, Ome; Takashi Yamazaki, Katsuta; Hideo Todokoro, Tokyo, all of Japan

[73] Assignee: Hitachi, Ltd., Tokyo, Japan

[21] Appl. No.: 858,575

[22] Filed: Mar. 27, 1992

[30] Foreign Application Priority Data

Apr. 1, 1991 [JP] Japan .................. 3-068222

[51] Int. Cl.$^5$ ........................... H01J 37/304
[52] U.S. Cl. ..................... 250/492.2; 250/398
[58] Field of Search ............... 250/492.2, 398

[56] References Cited
FOREIGN PATENT DOCUMENTS 2-114629  4/1990  Japan ................. 250/492.2
2-202012 10/1990  Japan .

OTHER PUBLICATIONS
J. Vac. Sci. Technol. B3(1), Jan./Feb. 1985 pp. 98–101.

*Primary Examiner*—Jack I. Berman
*Attorney, Agent, or Firm*—Fay, Sharpe, Beall, Fagan, Minnich & McKee

[57] ABSTRACT

The present invention relates to a system for drawing patterns on a wafer by using a charged particle beam such as an electron beam, in which a complicated prealigning mechanism used for mounting the wafer on a stage is omitted. Instead, according to the present system, rotation of the wafer is detected and a shaped beam is rotated by an amount corresponding to the value detected. Subsequently, a predetermined pattern is drawn on the substrate. The system includes a detecting device for detecting the rotation of the wafer by using an orientation flat or adjusting marks; a computer for storing a value corresponding to the rotation thus detected; a rotating lens control circuit for receiving data from the computer; and a rotating lens.

11 Claims, 3 Drawing Sheets

CHARGED PARTICLE BEAM LITHOGRAPHY SYSTEM AND METHOD THEREFOR

BACKGROUND OF THE INVENTION

1. Field of the Invention

The present invention relates to a system for drawing patterns of LSI, etc., directly on a substrate such as a wafer, etc., having an orientation flat and adjusting marks, by using a charged particle beam such as an electron beam having a rectangular cross-section, etc.

2. Description of the Related Art

Heretofore, in a variably-shaped-electron-beam lithography system for drawing a pattern on a wafer having an orientation flat and adjusting marks, the direction of the orientation flat is made to coincide with the X or Y direction of the X-Y movement of a sample table within about 5 to 10 mrad, and thereafter the direction is determined by using the adjusting marks by means of a prealigner within about 1 mrad (JP-A-Hei 2-202012). The prealigner may be located either in a sample chamber or outside thereof, but in all cases the construction is complicated.

The reason why a high-precision prealignment is required will be explained, referring to FIG. 2. If the prealigned state is bad, e.g. if the orientation flat is rotated by $\theta$ radians with respect to the moving direction of the stage, as indicated in FIG. 2, chips positioned on the wafer are rotated also by $\theta$. It is easy to rotate the deflection direction of the electron beam used for the drawing by $\theta$ by detecting the adjusting marks to effect adjusting correction. This was effected heretofore.

However, since the shaped beam itself was not rotated, e.g. in the case where a line was drawn by using the shaped beam, there was a problem that the line was drawn stepwise, as indicated in FIG. 3. That is, supposing that the greatest dimension, of the shaped beam is $\iota$ $\mu$m, the deviation $\Delta \iota$ between two adjacent shots due to the shaped beam is equal to $\iota \times \Delta \theta$.

Now, supposing that $\iota=10$ $\mu$m and $\theta=5$ mrad, $\Delta \iota=0.05$ $\mu$m. The pattern of different shots exposed on a photosensitive resin is stepwise, as indicated in FIG. 3. In order that this stepwise pattern on the photosensitive resin be invisible, $\Delta \iota<0.01$ $\mu$m is necessary. Consequently it was necessary to carry out the prealignment so that $\theta$ is smaller than 1 mrad.

As described above, since prealignment work was necessary for the prior art system, extra devices and extra work were required. Concretely speaking, as one of the extra devices it can be cited that the wafer stage had a rotation adjusting function, in the case where the rotational angle was great. In this way the construction of the stage was very complicated, which could produce worsening in vacuum, sticking of dust on the wafer, trouble, and lowering in the drawing precision. Additionally, the system was expensive due to its complexity. Further, in the case where it was difficult to dispose the rotating function on the stage, the wafer rotation adjusting function was disposed within an external prealigner. Also, in this case, a problem similar to that described above took place.

SUMMARY OF THE INVENTION

The object of the present invention is to provide a charged particle beam lithography system, by means of which such a prealigner and prealigning work can be omitted, and it is possible to shorten operation time and to realize high precision drawing.

In order to minimize stitching error due to the direction difference between the shaped beam and the beam deflection, in an electron beam exposure system according to the present invention, the orientation flat or the adjusting mark is detected optically or by using the electron beam itself to detect the wafer rotation direction, and data thus obtained are given from a control computer to an electron beam rotating lens. In this way drawing is effected by using a shaped beam, whose direction is in accordance with the direction of the orientation flat.

In the prior art system, since it was impossible to adjust the rotational direction of the shaped beam itself, rotation adjustment of the wafer itself was effected by means of the prealigner until the rotation of the wafer itself was below an allowed limit, e.g. below 1 mrad.

Contrarily thereto, according to the present invention, the shaped beam itself is rotated, since the prior art prealigning function is unnecessary.

At first, in order to detect the rotation, X, Y coordinates of 2 points on the orientation flat or at least two alignment marks are detected.

In the case where there is one optical detecting means, the X, Y coordinates can be detected by moving the stage so that the two measured points are brought so as to be successively just under the detecting means. In the case where a plurality of optical detecting means are disposed at positions in accordance with previously known marks, the rotational angle of (mis)alignment of the wafer can be measured by detecting the respective coordinates. The electron beam may be used as means for detecting the marks. In this case movement of the stage is unnecessary.

The amount of rotation thus detected is given to a computer and the computer drives a beam rotating lens, based on these data. In this way it is possible to give the shaped beam a required amount of rotation.

DESCRIPTION OF THE PREFERRED EMBODIMENTS

Hereinbelow the present invention will be explained, using an embodiment.

Figure 1:
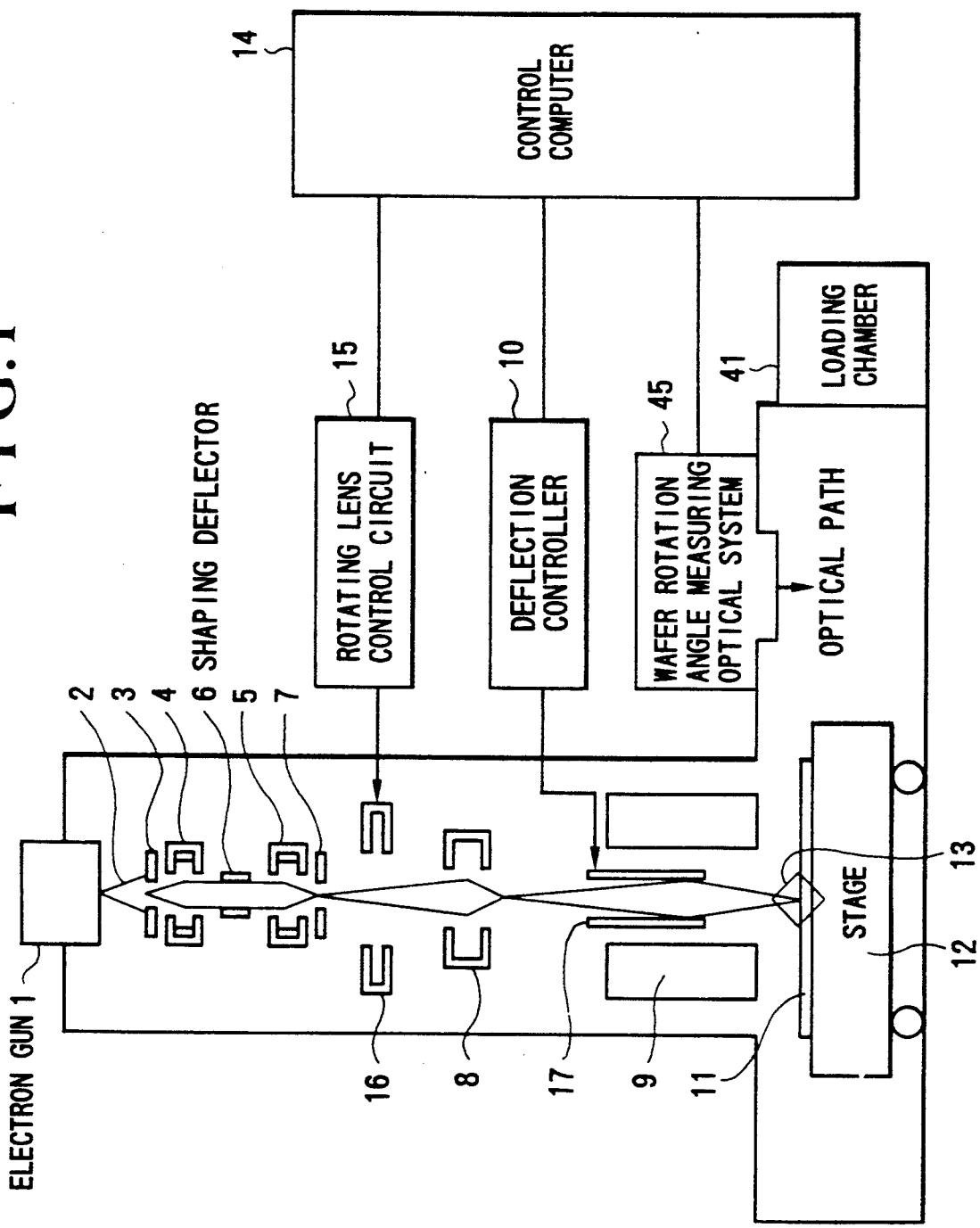
FIG. 1 is a schematic block diagram of an embodiment of the present invention.

FIG. 1 indicates an electron beam lithography system which is an embodiment of the present invention. An electron beam emitted by an electron gun 1 passes through a first and a second shaping lens 4 and 5, and a beam size shaping deflector 6 after having passed through a first shaping aperture, and is formed into an arbitrary rectangular beam by a second shaping aperture 7. The rectangular electron beam thus shaped passes through a demagnifying lens 8 and an objective lens 9 and is projected to an arbitrary point within a deflection field on a wafer 11 by a beam deflecting system 10. The wafer 11 is mounted on a stage 12 movable in the X-Y directions. The beam is shaped by the two shaping apertures 3 and 7 and a demagnified beam thereof is formed on the wafer. It is possible to draw a desired pattern on the wafer by controlling the beam deflection and ON-OFF of the beam by means of a computer.

Since, in the course of the process, chips are arranged on the wafer roughly parallelly to the orientation flat, when the wafer is mounted on the stage, it is located so as to be roughly aligned by previous mechanical positioning by means of a wafer roader. In general, it is inclined by an angle $\theta$ with a precision within 5 to 10 mrad with respect to the X-movement direction or the Y-movement direction of a sample table.

Figure 2:
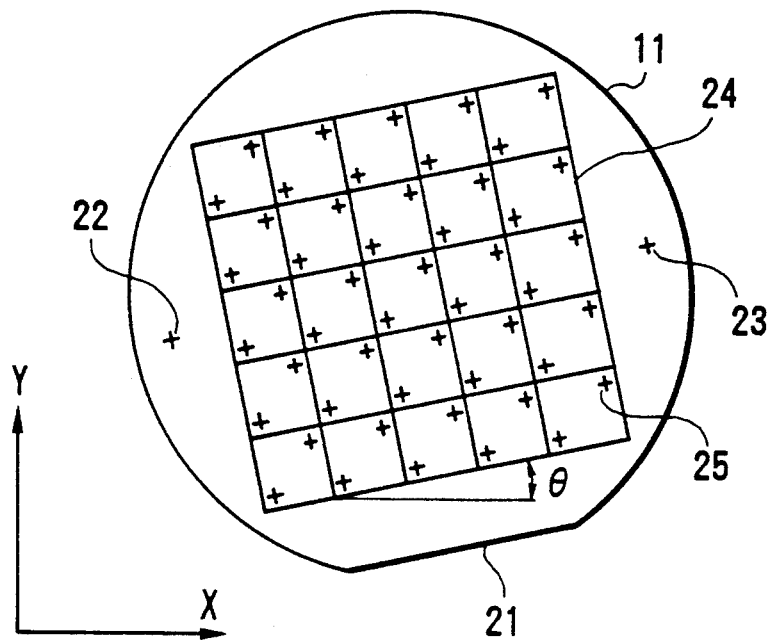
FIG. 2 is a diagram indicating a relation between the orientation flat and the directions X-Y of the stage movement.
Figure 3:
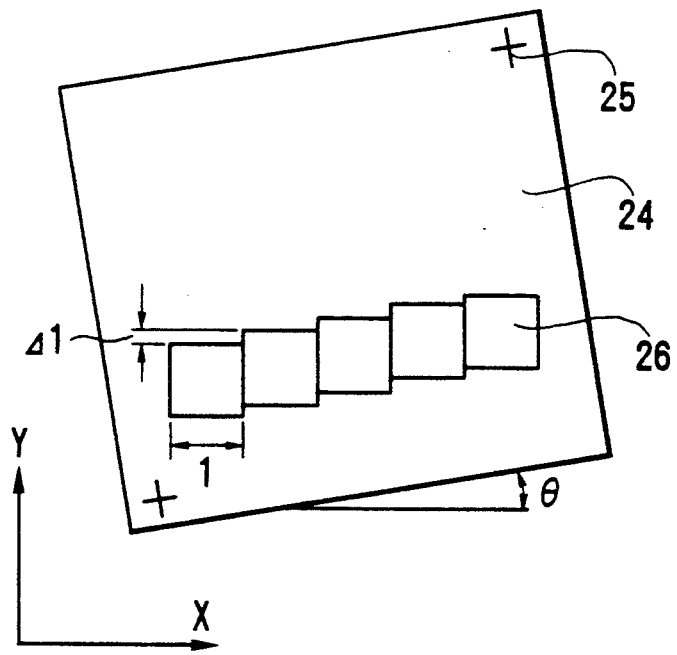
FIG. 3 is a diagram indicating stitching errors due to the directional difference between the shaped beam and the beam deflection, when the amount of rotational misalignment of a wafer is great.
Figure 4:
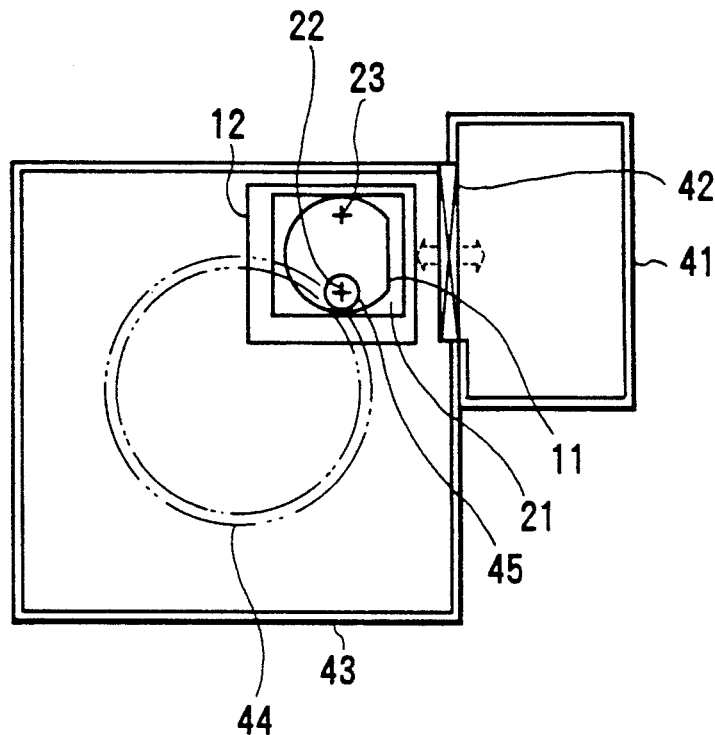
FIG. 4 is a plan view of an electron beam lithography system according to the present invention.

FIG. 2 indicates a relation in a coordinate system between the orientation flat 21 or wafer alignment marks 22, 23 and the arrangement of chips 24. On the other hand, FIG. 4 shows means for detecting this angle $\theta$. FIG. 4 indicates a state where the wafer 11 is transported from a loading chamber 41 through a gate valve 42 to the stage 12 in a sample chamber 43 to be mounted thereon. The reference numeral 44 represents an electron optical system located in the neighborhood of the center of the sample chamber.

FIG. 4 represents also a plan view of the system indicated in FIG. 1. In FIG. 4, the reference numeral 45 indicates an optical system for measuring the rotation angle of the orientation flat. In the present embodiment the alignment marks 22, 23 are on the wafer. For the wafer introduced from the chambers 41, the position of the mark 22 is measured by an optical microscopic system 45.

Next, the mark 23 is sent to the system 45 and the coordinates of the mark 23 are measured. Forwarding distance and coordinate data are sent to the computer 14 in FIG. 1 and the inclination $\theta$ with respect to the movement axes X-Y of the stage is calculated. In the case where the two mark positions are detected by two optical microscopic systems, for which the relative positions thereof are known, an advantage is obtained that the movement of the stage can be omitted.

Figure 5:
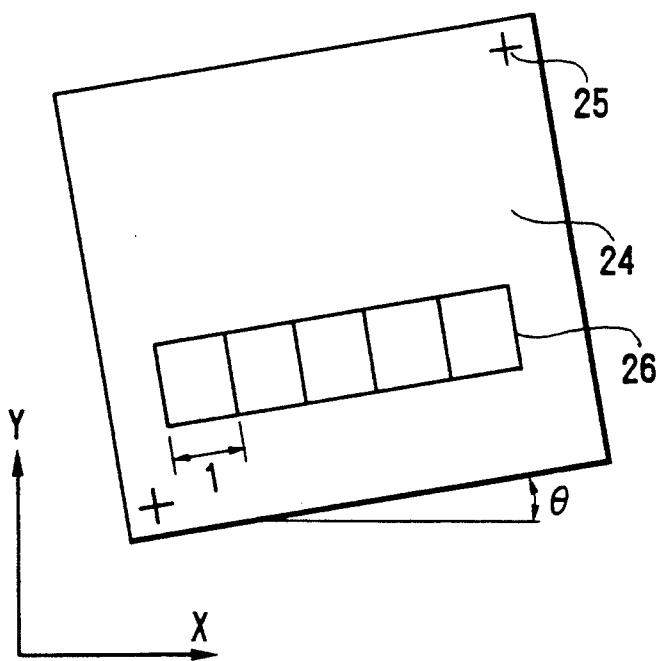
FIG. 5 is a diagram indicating stitching errors due to the directional difference between the shaped beam and the beam deflection after a rotation of the beam according to the present invention.

Then, the computer 14 makes the rotating lens control circuit 15 in FIG. 1 flow suitable exciting current, depending on this angle $\theta$. The rotating lens 16 in FIG. 1 is constituted by a so-called solenoid coil. The rotation angle $\theta$ is proportional to a product of the number of turns N of the coil by the exciting current I. Further, the setting position thereof in the Z direction is approximately at the middle point between the second shaping aperture 7 and the demagnifying lens 8. It is easy to make it so that it has a function of giving the rotation of the beam itself, but the influences thereof on the demagnification of the shaped beam 13 formed by the shaping apertures 3 and 7 are almost negligibly small. That is, since it is designed so as to have substantially almost no influences on beam blurring and to give only the rotating function, when a line is drawn, it is possible to adjust the direction of the shaped beam, as indicated in FIG. 5.

The rotation angle by the rotating lens is usually below 10 mrad and the deviations of the optical axis by the rotation are not significantly greater. However, when the rotational angle exceeds 10 mrad, the beam axis may be deviated. Thus, the beam can be interrupted in the course and the current density of the shaped beam 13 can be non-uniform. In such a case, although it is not specifically indicated in the figure, when an alignment coil for adjusting the optical axis is disposed between the rotating lens and the beam 13, the non-uniformity of the beam density can be prevented by driving it in synchronism with the rotating lens to adjust the optical axis at its optimum.

Although in the above embodiment the orientation flat detection was effected in an optical manner, it is a matter of course that it may be effected by using the electron beam itself used for the drawing. That is, in FIG. 1, it is possible of course to utilize the mark detecting function by deflecting the shaped beam 11 by means of the deflector 10 to detect the positions of the marks 22 and 23 in order to detect the rotation angle $\theta$ of the orientation flat.

Further, although the present invention has been described in the above with respect to a variably-shaped electron beam lithography system, it is a matter of course that it can be applied also to a similar system which uses not only an electron beam but also an ion beam.

As described above, according to the present invention, since it is not necessary to adjust accurately the direction of the wafer by rotating it, no prealignment work is required. That is, it is not necessary to dispose a function of adjusting the rotation after the mounting of the wafer on the stage or within the loading chamber for the prealigning function and thus the mechanism is remarkably simplified. This leads to remove a serious cause of lower drawing precision resulting from the magnetic field of a motor for giving the rotation function or vibration of the stage, in the case where the rotation function is disposed on the stage. Further, since it is possible to shorten the time required for the realigning work from $\frac{1}{3}$ to $\frac{1}{4}$ the time, it leads to an increase in through-put.

We claim:

1. A charged particle beam lithography method, comprising the steps of:
    shaping a charged particle beam by passing the charged particle beam through an aperture;
    detecting a rotation angle of a substrate having at least one orientation flat and a mark;
    projecting the charged particle beam to the substrate;
    rotating the charged particle beam in a direction of the rotation angle of the substrate by an amount substantially equal to the rotation angle; and
    drawing a predetermined pattern on the substrate with the rotated charged particle beam.

2. A method according to claim 1, wherein said step of rotating the charged particle beam includes a step of driving an alignment coil, for adjusting an optical axis, in synchronism with the rotation of the charged particle beam.

3. A method according to claim 1, wherein said step of drawing a predetermined pattern on the substrate includes a step of deflecting the charged particle beam.

4. A method according to claim 1, further comprising, before the step of projecting a charged particle beam, the step of
    moving the substrate from a loading chamber through a gate valve to a stage.

5. A method according to claim 1, wherein said steps of detecting a rotation angle includes the step of detecting two mark positions on the substrate using two optical microscopic systems with known relative positions.

6. A method according to claim 1, wherein said step of rotating the charged particle beam is accomplished by using a solenoid coil as a rotating lens.

7. A method according to claim 1, wherein said step of detecting a rotation angle includes a step of moving the charged particle beam across the substrate.

8. In a method of manufacturing integrated circuitry, a charged particle beam lithography method comprising the steps of:

mounting a wafer, having an orientation flat, onto a stage having X and Y axes;

determining the orientation of the wafer on the stage by detecting a rotation angle of one of the orientation flat of the wafer and marks provided on the wafer;

projecting a charged particle beam from a charged particle source, through a shaping lens, a shaping aperture, a rotating lens, a demagnifying lens and an objective lens, to the wafer;

rotating the charged particle beam by an amount substantially equal to the detected rotation angle by using a solenoid coil as the rotating lens in a manner so as to avoid substantial demagnification and beam blurring; and thereafter drawing a predetermined pattern on the wafer by controlling a beam deflector.

9. A method according to claim 8, wherein the projecting step is performed so that the charged particle beam is shaped into a rectangular beam by using the shaping aperture.

10. In a method of manufacturing integrated circuitry, a charged particle beam lithography method comprising the steps of:

mounting a wafer, having two marks formed thereon, onto a stage having X and Y axes;

determining the orientation of the wafer on the stage by detecting the position of the two marks, by using two optical microscopic systems with known relative positions, and calculating a rotation angle based on the location of the two marks with respect to the X and Y axes of the stage;

projecting a charged particle beam from a charged particle source, through a shaping lens, a shaping aperture, a rotating lens, a demagnifying lens and an objective lens, to the wafer;

rotating the charged particle beam by an amount substantially equal to the detected rotation angle by using a solenoid coil as the rotating lens in a manner so as to avoid substantial demagnification and beam blurring; and thereafter drawing a predetermined pattern on the wafer by controlling a beam deflector.

11. A method according to claim 10, wherein the projecting step is performed so that the charged particle beam is shaped into a rectangular beam by using the shaping aperture.

* * * * *